(12) United States Patent
Truong

(10) Patent No.: US 6,216,421 B1
(45) Date of Patent: Apr. 17, 2001

(54) DEVICE FOR SEATING AND UNSEATING A LID FROM A CARRYING CASSETTE

(75) Inventor: Michael Truong, San Jose, CA (US)

(73) Assignee: H-Square Corporation, Sunnyvale, CA (US)

( * ) Notice: Subject to any disclaimer, the term of this patent is extended or adjusted under 35 U.S.C. 154(b) by 0 days.

(21) Appl. No.: 09/346,661

(22) Filed: Jul. 1, 1999

(51) Int. Cl.$^7$ .................................................. B65B 43/26
(52) U.S. Cl. ...................... 53/381.4; 53/382.1; 53/381.1
(58) Field of Search ............................... 53/381.1, 381.4, 53/381.7, 382.1

(56) References Cited

U.S. PATENT DOCUMENTS

| | | | |
|---|---|---|---|
| 3,614,854 | * 10/1971 | Mundt et al. | 53/382.1 |
| 5,314,068 | * 5/1994 | Nakazato et al. | 206/454 |
| 5,476,023 | * 12/1995 | Calendro | 81/3.57 |
| 5,657,617 | 8/1997 | Allen et al. | 53/487 |
| 5,894,711 | * 4/1999 | Davidson et al. | 53/381.4 |

* cited by examiner

Primary Examiner—Peter Vo
Assistant Examiner—Louis Huynh
(74) Attorney, Agent, or Firm—Terry McHugh

(57) ABSTRACT

A method and a system for seating and unseating cassette lids from cassettes include utilizing two upright guides that are spaced apart by a distance that causes each guide to project between a cassette and a flap of a cassette lid. Outwardly facing surfaces of the guides are sloped such that the guides have an increasing cross sectional area with approach toward a base of the device. In an unseating operation, downward pressure is applied to the cassette lid, causing the flaps of the cassette to follow the sloped contour of the outwardly facing guide surfaces. The configuration of the guides causes the flaps to separate from the downwardly moving cassette. When the pressure is relaxed, material memory causes the lid to return to its original shape, sliding up the guides while the cassette remains in place. For some cassettes, structure for retaining the cassette in position may be beneficial. In a seating operation, the cassette is placed on the base and the lid is positioned above the cassette with the flaps in contact with the sloped outwardly facing guide surfaces. Downward pressure is applied to the lid, causing the flaps to follow the contour of the sloped surfaces. Again, the lid is deformed. However, when the cassette and cassette lid are raised in unison, the flaps are brought into a position of engagement with the cassette.

13 Claims, 6 Drawing Sheets

DEVICE FOR SEATING AND UNSEATING A LID FROM A CARRYING CASSETTE

TECHNICAL FIELD

The invention relates generally to devices and systems for manipulating carrying cassettes and more particularly to seating and unseating cassette lids from cassettes of the type used to transport disks.

BACKGROUND ART

There are a variety of types of cassettes for storing disks, such as disks that are coated with magnetic recording material or laser recordable material for storing data, audio information, video information, and the like. Some cassettes are specifically designed for use in automated transfer systems. For example, a cassette may be used to transfer magnetic disks ("hard disks") from one station of an automated system to another station. Other cassettes are designed for shipping disks from one facility to another.

An example of a cassette for handling disks is shown in FIG. 1. The cassette 10 includes opposed lengthwise walls 12 and 14 and opposed widthwise walls 16 and 18. Projections 20 along the interior circumference of the lengthwise walls form slots 22. Disks, such as magnetic recording disks, are retained in parallel spaced-apart relation by the projections 20. A cassette lid 24 includes a pair of downwardly depending flaps 26 and 28. The configuration of the flaps and the widthwise walls 16 and 18 of the cassette 10 allow the lid to be fastened to the cassette. Typically, the lid is snap-fit to the cassette, but a friction-fit may be substituted. Optionally, the cassette may have a bottom cover that is removable to expose the lower edges of the stored disks. Thus, an elevator blade may extend upwardly through the cassette to individually lift disks to and from the cassette.

While cassettes operate well for their intended purposes, there are concerns relating to use of the cassettes. In a single working shift, a person within a fabrication area may be required to manually seat and unseat a number of lids from cassettes. In the example cassette 10 of FIG. 1, the cassette lid 24 is securely fit to the cassette 10 in order to minimize the risk of the lid inadvertently being removed when disks within the cassette may be exposed to an "unclean" area. Particles that settle on a magnetic disk or semiconductor wafer will negatively impact manufacturing yields. A secure fit is assured by forming the lid of a pliable material that has a strong material memory. That is, the flaps may be deformed outwardly by applying sufficient force at the bottom of the flaps, but the cassette lid will return to its original condition when the outward force is removed. Thus, the flaps snap onto the widthwise walls 16 and 18 of the cassette. One concern is that the repetitive seating and unseating of cassette lids may cause prolonged stress pains to the body of the fabrication personnel. A significant force must be applied to the lid in order to deform the lid. Another concern is that the seating and unseating of lids will cause particle generation. Even though the cassettes and cassette lids are formed of low or non-particulating material, minute particles may be generated as the flaps forcibly slide into and out of position.

An automated seating and unseating apparatus is described in U.S. Pat. No. 5,657,617 to Allen et al. The apparatus utilizes pneumatic pressure to mechanically remove a cassette lid. Fingers are moved downwardly from above the cassette to a position adjacent to the bottoms of the flaps to be removed. The fingers are then shifted into a position to apply outward force to the flaps. The outward force deforms the lid, allowing the apparatus to be moved upwardly. After the lid is sufficiently high to clear the cassette, the cassette is repositioned or the disks are removed from the cassette.

The automated apparatus of Allen et al. operates well for a mass production area that includes the necessary electrical and pneumatic utilities. However, the apparatus is not well suited for applications that require portability and applications in which the required utilities are not available. What is needed is a stand-alone device and method for seating and unseating cassette lids from cassettes. What is further needed is such a method and device that do not impose significant bodily stress on an operator and do not generate contamination particles during operation.

SUMMARY OF THE INVENTION

A method and a system for seating and unseating cassette lids from cassettes include two upright guides that are spaced apart to project between a cassette and a pair of flaps of a cassette lid. When downward force is applied to the cassette lid, the lid deforms as the flaps slide along the exterior surfaces of the upright guides. The release of the downward pressure causes the lid to raise, while the cassette remains in place. Thus, the lid is no longer fitted to the cassette. The reverse process may be used to reseat the lid.

The device includes a base and the two upright guides. The guides have upper extents with inwardly facing surfaces that are spaced apart by a distance slightly greater than the length of the cassette. Outwardly facing surfaces of the guides are spaced apart by a distance slightly less than the distance between the flaps of the cassette lid. Consequently, when the cassette is positioned between the two guides, the guides project between the cassette and the two lids.

The outwardly facing surfaces have a sloped contour, with the surfaces diverging from each other with approach to the plane of the base. Preferably, the inwardly facing surfaces are substantially vertical. The height of the guides is greater than the distance between the bottom of the flap and the bottom of the cassette. As a result, the bottom of the cassette is suspended above the base until the unseating operation is initiated.

During the unseating operation, downward pressure is applied to the top of the cassette lid. Because the outwardly facing surfaces of the guides are sloped, the downward pressure on the lid will cause the flaps to extend horizontally while the cassette moves vertically. This frees the cassette from the means for fastening the cassette lid to the cassette. The fastening means is not critical to the invention, but may include friction-fit techniques and snapfit techniques.

When the bottom of the cassette reaches the surface of the base, the downward pressure on the cassette lid may be released, allowing the plastic deformation of the cassette to provide the force for moving the cassette lid relative to the cassette. In some applications, the base includes a raised guide support that is dimensioned to frictionally fit to the bottom of the cassette, ensuring that the cassette is not moved upwardly with the lid. The raised guide support may be designed to contact either or both of the inside or the outside of the wall that forms the bottom of the cassette.

The seating operation reverses the steps of the unseating operation. A cassette is rested in the cassette-receiving area of the base. This positions the cassette such that the widthwise ends are adjacent to the upright guides. A cassette lid is then positioned in alignment with the cassette, such that the flaps contact the outwardly facing surfaces of the guides. The center region of the lid is pressed downwardly into contact with the upper rim of the cassette. During the downward travel of the center region of the lid, the flaps will have a horizontal component of motion, in addition to a vertical component. Thus, the flaps will be spaced apart from the sides of the cassette. Then, the cassette and cassette lid are simultaneously moved upwardly until the flaps contact the widthwise sides of the cassette, causing the lid to be fastened to the cassette.

By controlling the motion of the flaps relative to the cassette, the seating and unseating operations are less likely to generate particles than if the operations are executed solely by hand. Moreover, the device and method are less likely to exert undue stresses on the individual who is assigned to removing or seating cassette lids.

While the device and method have been described with reference to a passive embodiment, there may be some applications in which automation is desired. In these applications, an automated member may be used to apply the downward pressure on the cassette and to apply lift to the lid following a seating operation or to apply lift to the combination of the lid and cassette following a seating operation. The invention is considered to be primarily for use in the magnetic disk fabrication industry, but other uses are contemplated. For example, the device and method may be employed with cassettes used for other types of recording media members (e.g., DVDs and CD-ROMs) and with cassettes used in the integrated circuit fabrication industry.

DETAILED DESCRIPTION

Figure 1:
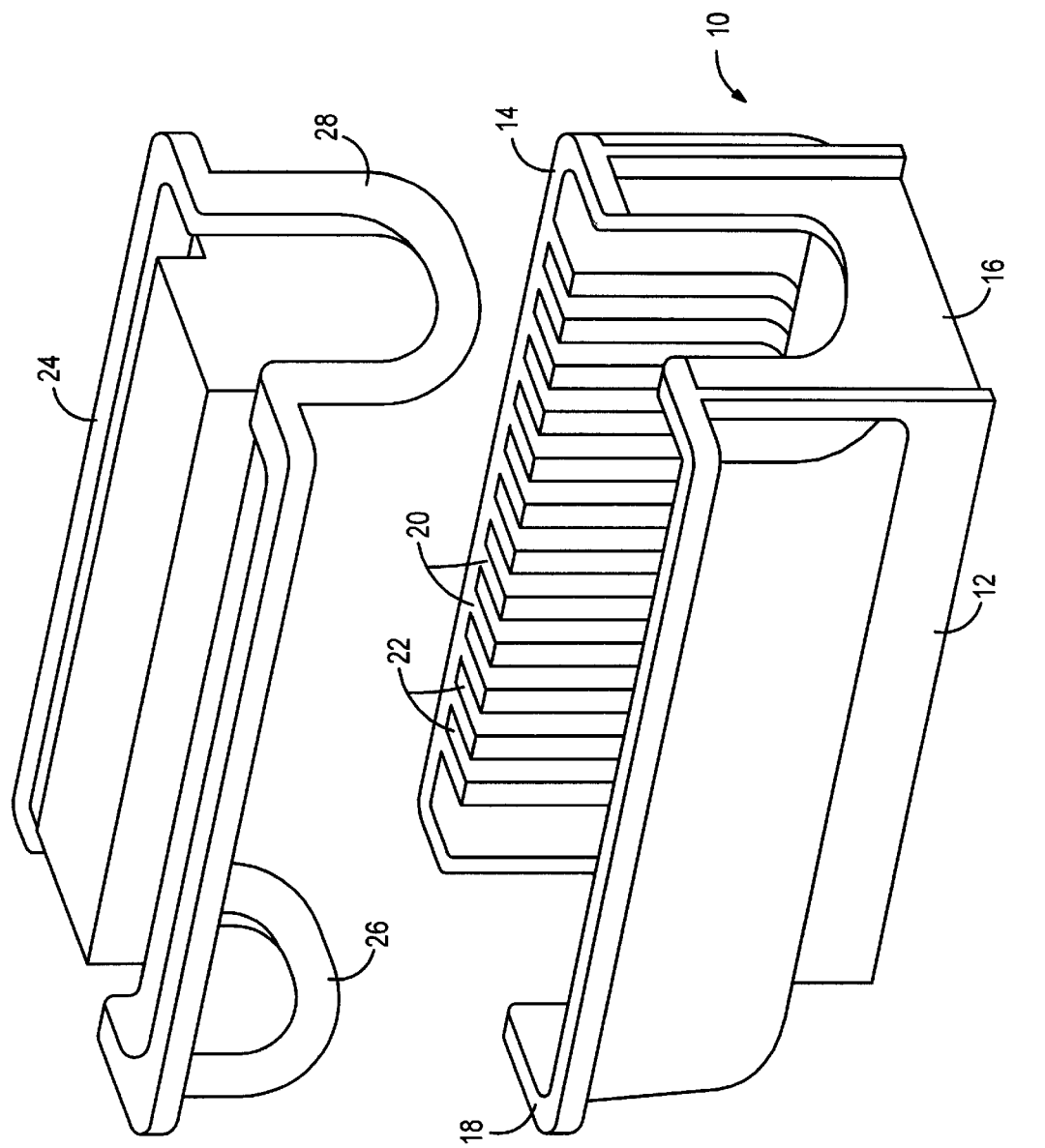
FIG. 1 is a perspective view of a conventional disk cassette with a lid positioned above the cassette.
Figure 2:
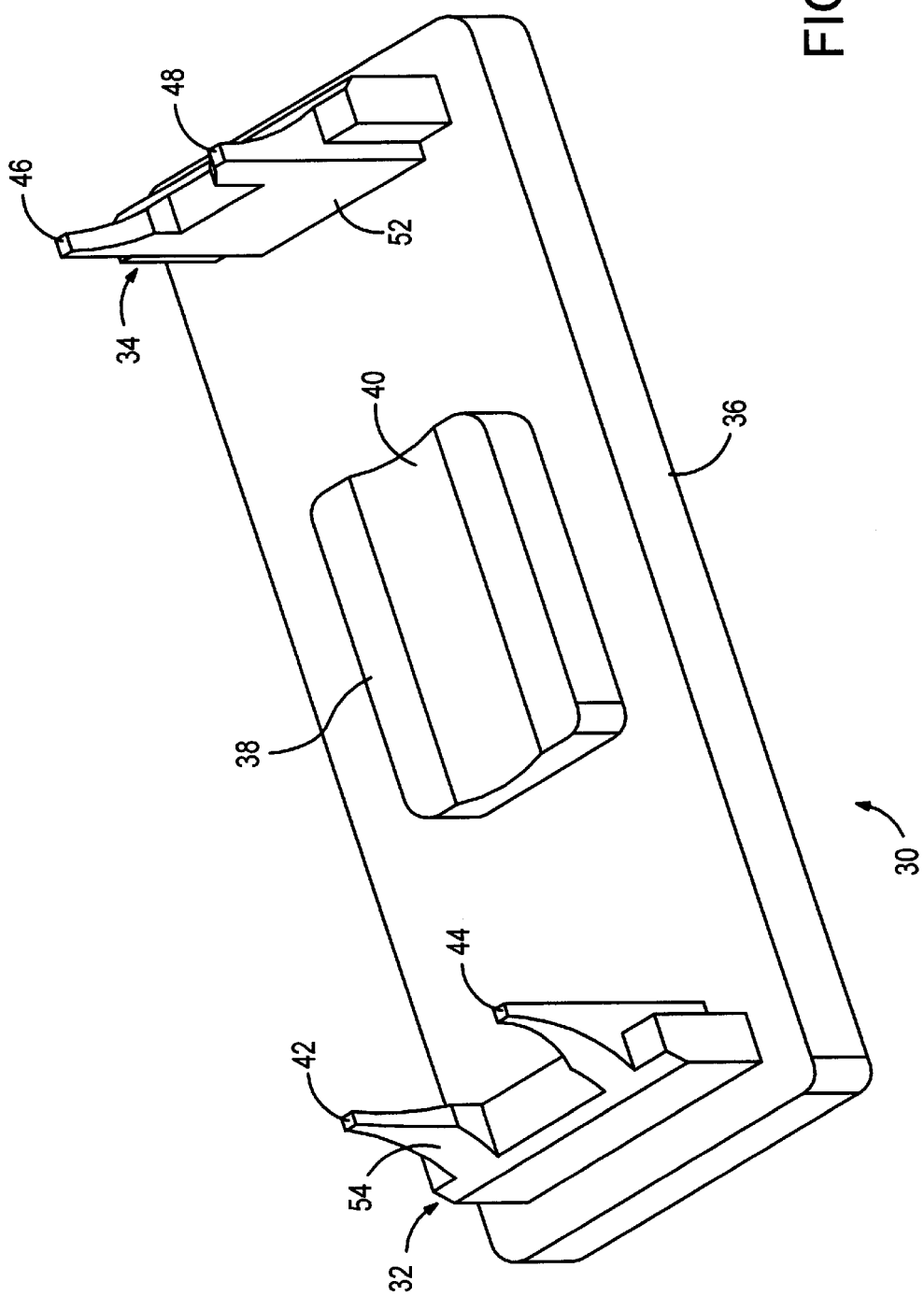
FIG. 2 is a perspective view of a cassette lid seating and unseating device in accordance with the invention.

With reference to FIG. 2, a lid seating and unseating device 30 is shown as including a pair of upright guides 32 and 34 extending upwardly from a base 36. The device is a stand-alone arrangement for removing or replacing lids from cassettes of the type shown in FIG. 1. However, the operational principles to be described below can be applied equally to removing and replacing lids from other types of cassettes.

The device 30 also includes a guide support 38. The guide support is dimensioned to fit within the bottom of a cassette, but to provide a degree of friction fit with the cassette. That is, the guide support 38 has a dimension that is only slightly less than the distance between opposite sides of the cassette. Consequently, when the cassette lid is removed from the cassette, the upward movement of the cassette lid does not dislodge the cassette from the base 36. The use of a guide support is only necessary with some types of cassette. The structure of a guide support is not critical. The one shown in FIG. 2 is received within the lower portion of the cassette. The guide support includes an arcuate center region 40 that accommodates the curvature of the magnetic disk, optical disk, semiconductor-related disk, or the like. However, other embodiments of guide supports may be utilized. For example, the guide support may be a structure that contacts the outer edges of the cassette, rather than the inner edges. As another example, the guide support may be a number of posts that individually contact the surface of the cassette, but collectively hold the cassette in position.

A cassette-receiving area is defined between the two upright guides 32 and 34. The dimensions of the area are determined by the cassette for which the device 30 is designed. The distance between the two upright guides should be slightly greater than the length of the cassette, but slightly less than the distance between the two flaps of the cassette lid. Consequently, when a cassette, such as the one shown in FIG. 1, is inserted into the device 30, the upper extents 42, 44, 46 and 48 of the guides will project between the cassette and the flaps. In one embodiment, the distance between the two guides is 20 cm. The total length of the base 36 may be 25.25 cm, while the width may be 11.5 cm. Regarding the guide support 38, its dimension parallel to the length of the base may be 6.5 cm, while the dimension parallel to the width of the base may be 6.8 cm.

The device 30 is preferably made of a low particulating material. An acceptable material is (UHMW, Ultra High Molecular Weight Polyethylene) but other materials may be substituted.

Figure 3:
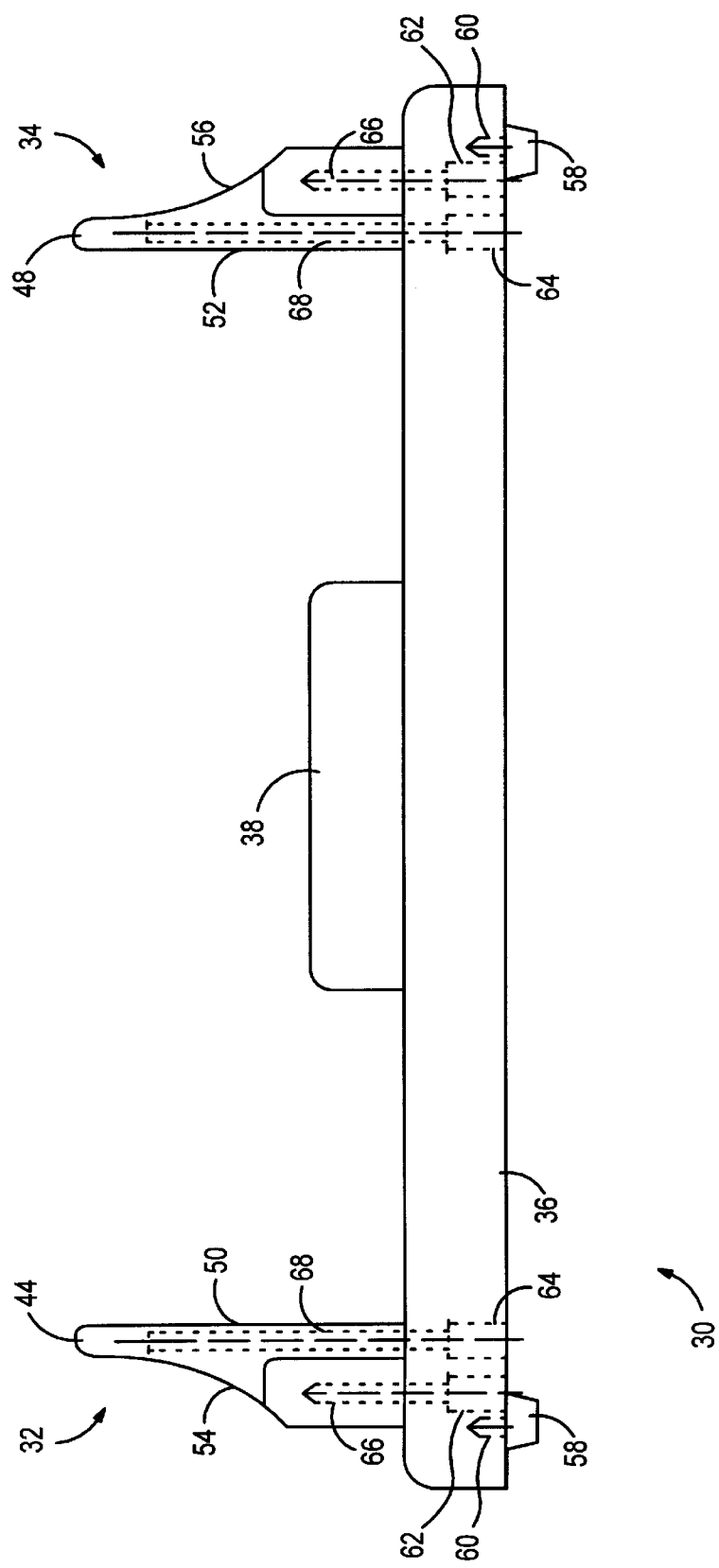
FIG. 3 is a side view of the device of FIG. 2.
Figure 4:
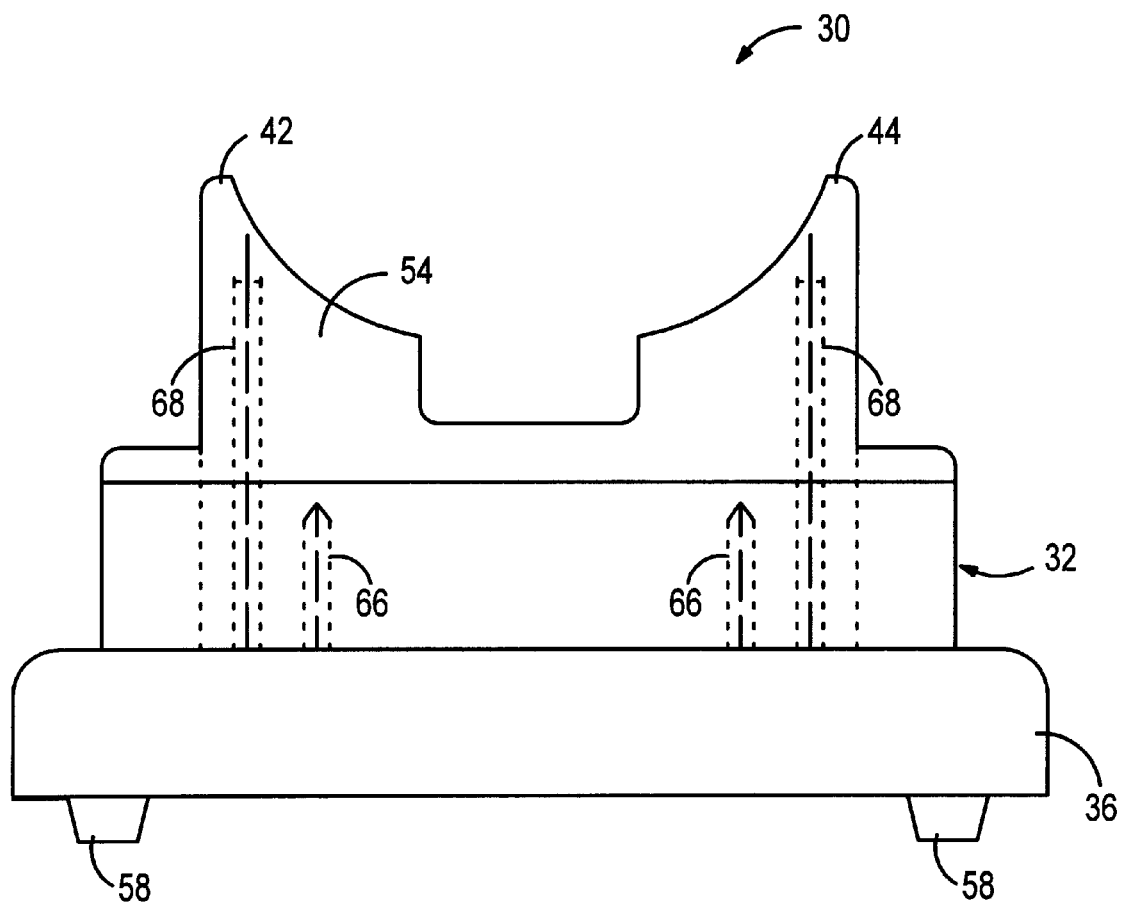
FIG. 4 is an end view of the device of FIG. 3.

Referring now to FIGS. 2 and 3, the height of each upright guide 32 and 34 is greater than the distance between the bottom of the cassette and the bottoms of the flaps. The inwardly facing surfaces 50 and 52 of the guides are vertical, so as to properly direct a cassette that is contact with the inwardly facing walls. At least the upper region of the guides include outwardly facing surfaces 54 and 56 that diverge with distance from the upper extents 42–48. The slope of the outwardly facing surfaces controls the deformation of a cassette lid during use of the device 30. That is, since the flaps travel along the outwardly facing surfaces, the slope of the surfaces determine the degree to which the cassette lid will be deformed.

The device 30 includes four rubber feet 58 that are fixed to the base 36 by externally threaded screws, not shown. The internally threaded bores 60 for receiving the screws are shown in phantom in FIG. 3. Similarly bores 62 and 64 are formed in the base 36 in alignment with internally threaded bores 66 and 68 within the upright guides 32 and 34. Metal screws extend through the base and thread into the bores 66 and 68 of the upright guides.

An unseating operation will be described with reference to FIGS. 2–5. In step 70, the cassette is located on the device 30 such that the interfaces of the cassette lid flaps with the cassette is along the upright guides 32 and 34. Typically, the guides will extend partially into the gaps between the flaps and the cassette walls. The radius of curvature of the guides as viewed in the rear view of FIG. 4 may be matched to the radius of curvature of the flaps 26 and 28 of FIG. 1. Since the height of the upright guides 32 and 34 is greater than the distance between the bottoms of the flaps and the bottom of the cassette, the cassette will be located above the surface of the base 36 after step 70 has been completed.

In step 72, pressure is applied to the lid. Typically, the pressure is applied by an individual, but automated techniques may be utilized. In applications in which automation is desired, a device having a low level of sophistication may be employed. The applied pressure is directed downwardly, but the compatibility of the radius of curvature of the flaps with the radius of curvature of the guides accommodates a degree of misdirection without causing adverse effects.

In step 74, the lid is deformed by pressure applied in step 72. The flaps slide along the outwardly facing surfaces 54 and 56 of FIG. 3 to separate the flaps from the sides of the cassette. By moving the flaps from the sides of the cassette, the cassette lid is released. The cassette itself has been moved downwardly and the plastic deformation of the lid biases the lid upwardly. As a result, when the downward pressure is relaxed, the flaps will slide up the outwardly facing surfaces 54 and 56. If the flaps contact the sides of the cassette, the misalignment of the flaps with the cassette will prevent reseating of the flap on the cassette. This allows the lid to be easily lifted from the cassette, as indicated at step 76. As a final step, the cassette may be removed from the device 30.

The operation of seating the cassette lid on the cassette will be described with reference to FIGS. 2, 3, 4 and 6. In step 78, the cassette is positioned on the surface of the base 36. The cassette is located between the two upright guides 32 and 34.

The lid is positioned in contact with the guides 32 and 34 in step 80. The lid should be in alignment with the cassette. Downward pressure is then applied to the lid in step 82 in order to deform the lid in step 84. The lid is deformed by forcing the flaps to follow the contour of the outwardly facing surfaces 54 and 56. When the center region of the cassette lid contacts the upper rim of the cassette, the lid and cassette are lifted in unison in step 86. This allows the lid to return to its original shape and allows the flaps to contact the widthwise sides of the cassette. Consequently, the cassette lid is again fastened to the cassette, thereby protecting the disks that are stored in the cassette.

Figure 5:
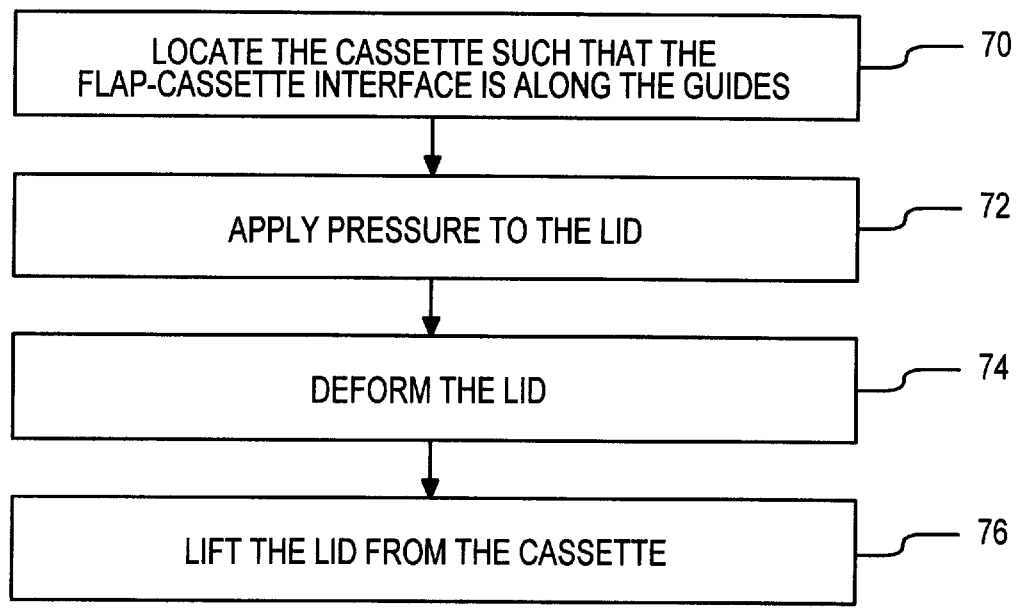
FIG. 5 is a process flow of steps for performing an unseating operation using the device of FIG. 2.
Figure 6:
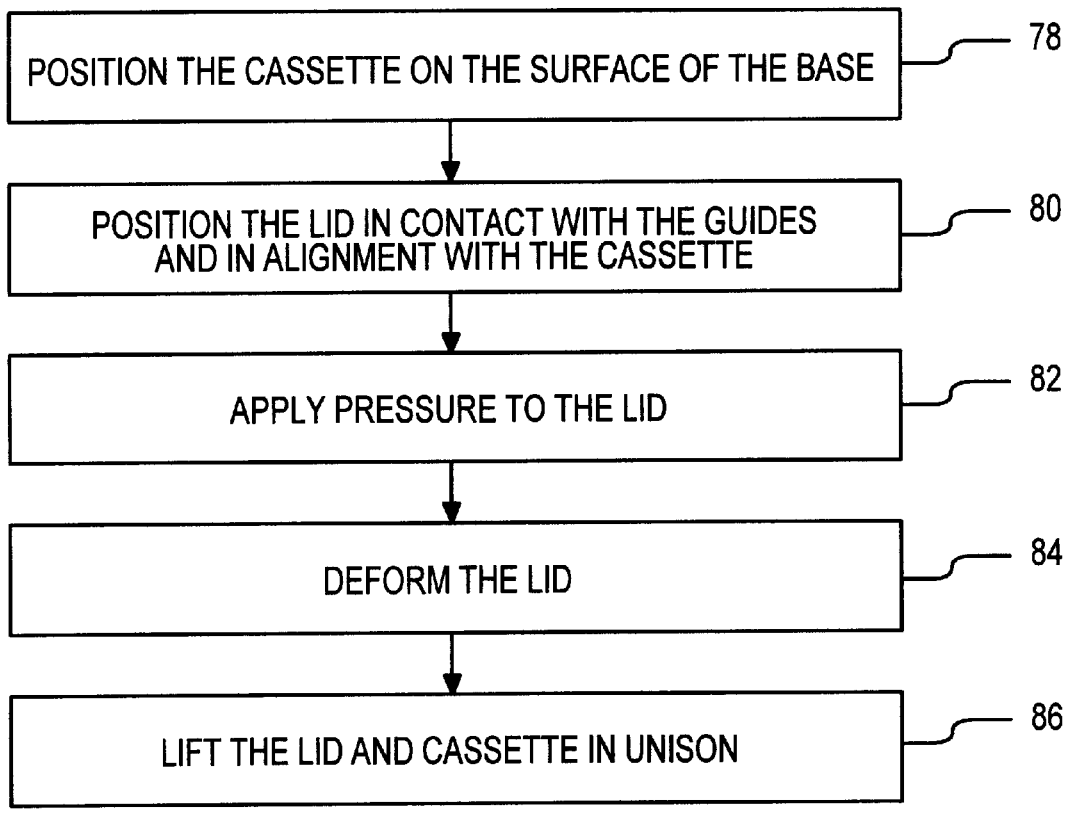
FIG. 6 is a process flow of steps for performing a seating operation using the device of FIG. 2.

As previously stated, the operations of FIGS. 5 and 6 may be executed using automated equipment with the device 30 of FIG. 2. However, the device is well suited for operation as a stand-alone device. Moreover, while the device and method are primarily intended for use with cassettes that store disk-shaped recording media, this is not critical. The invention can be employed with cassettes that store members that are not disk-shaped.

What is claimed is:

1. A device for seating and unseating a cassette lid from a cassette for storing a plurality of removable members, said cassette having a length and a width and having interior slots for retaining said removable members in a widthwise parallel relationship, said cassette lid having a pair of downwardly depending pliable flaps that are configured to fasten to opposite widthwise ends of said cassette, said device comprising:

a base;

a first guide extending upwardly from said base; and a second guide extending upwardly from said base, said first and second guides having upper extents with inwardly facing surfaces that are spaced apart by a distance slightly greater than said length of said cassette and with outwardly facing surfaces that are spaced apart by a distance slightly less than a distance between said pliable flaps of said cassette lid, each said first and second guide having an upper region with an expanding cross sectional dimension from said inwardly facing surface to said outwardly facing surface;

wherein said cassette lid is unseated by applying downward pressure on said cassette lid while said cassette is positioned such that said upper extents project between said cassette and said pliable flaps.

2. The device of claim 1 wherein said upper regions of said outwardly facing surfaces have contours that define slopes, said outwardly facing surfaces thereby diverging from each other as said outwardly facing surfaces approach said base.

3. The device of claim 2 wherein said inwardly facing surfaces are substantially vertical.

4. The device of claim 1 wherein said base includes a raised guide support that is dimensioned to friction fit to a bottom of said cassette.

5. The device of claim 1 wherein said first and second guides are formed of a low particulating material.

6. The device of claim 1 wherein said base and said first and second guides form a stand-alone device.

7. The device of claim 1 wherein said first and second guides are fixed in position.

8. The device of claim 7 wherein said base and said first and second guides have dimensions compatible with seating and unseating a cassette lid of a cassette that stores disk-shaped information storage media.

9. The device of claim 8 wherein said guides extend from said base by a distance greater than a distance from bottoms of said flaps to a bottom of said cassette.

10. A stand-alone device for seating and unseating a cassette lid from a cassette, said device comprising:

a base member; and a pair of guides extending perpendicular to said base member and being spaced apart by a distance to define an interior cassette-receiving area, said guides having outwardly facing exterior surfaces that slope downwardly and outwardly relative to said cassette-receiving area, said guides having upper extents that are dimensioned to project between said cassette and flaps of said cassette lid, said outwardly facing exterior surfaces being dimensioned to deform said flaps outwardly away from said cassette as said cassette is moved downwardly toward said base member, said base member and said guides being formed of a low particulating material.

11. The device of claim 10 wherein said guides are passive members having vertical inwardly facing interior surfaces.

12. The device of claim 11 wherein said vertical interior surfaces have a height greater than a distance from bottoms of said flaps to a bottom of said cassette.

13. The device of claim 10 further comprising a guide support in said cassette-receiving area, said guide support having compatible dimensions for contacting opposed edges of a bottom of said cassette, said cassette being a cassette having a plurality of information storage disks.

* * * * *